(12) United States Patent
Dowben et al.

(10) Patent No.: US 6,774,013 B2
(45) Date of Patent: Aug. 10, 2004

(54) N-TYPE BORON-CARBIDE SEMICONDUCTOR POLYTYPE AND METHOD OF FABRICATING THE SAME

(75) Inventors: Peter A. Dowben, Crete, NE (US); Anthony N. Caruso, Lincoln, NE (US); Yaroslav Losovyj, Baton Rouge, LA (US)

(73) Assignee: Board of Regents of University of Nebraska, Lincoln, NE (US)

( * ) Notice: Subject to any disclaimer, the term of this patent is extended or adjusted under 35 U.S.C. 154(b) by 0 days.

(21) Appl. No.: 10/289,032

(22) Filed: Nov. 6, 2002

(65) Prior Publication Data

US 2004/0084690 A1 May 6, 2004

(51) Int. Cl.[7] .......................... H01L 21/20; H01L 21/22
(52) U.S. Cl. ....................................... 438/478; 438/558
(58) Field of Search ................................. 438/478, 479, 438/485, 542, 558; 257/183, 199, 252, 77; 117/103, 951; 427/249.5, 255.2

(56) References Cited

U.S. PATENT DOCUMENTS

| | | |
|---|---|---|
| 4,957,773 A | 9/1990 | Spencer et al. |
| 5,468,978 A | 11/1995 | Dowben |
| 5,658,834 A | 8/1997 | Dowben |
| 6,025,611 A | 2/2000 | Dowben |

OTHER PUBLICATIONS

Seong–Don Hwang, N.B. Remmes, P.A. Dowben and D.N. McIlroy, "Nickel Doping of Boron Carbide Grown by Plasma Enhanced Chemical Vapor Deposition", *J. Vac. Sci. Technol.* B 14 (1996) 2957–2960.

Seong–Don Hwang, Ken Yang, P.A. Downben, Ahmad A. Ahmad, N.J. Ianno, J.Z. Li, J.Y. Lin, H.X. Jiang and D.N. McIlroy, "Fabrication of n–type Nickel Doped $B_5C_{1+\delta}$ Homojunction and Heterojunction Diodes", *Appl. Phys. Lett.* 70 (1997) 1028–1030.

Seong–Don Hwang, N. Remmes, P.A. Dowben and D.N. McIlroy "Nickel Doping of Boron Carbide and Fermi Level Shifts", *J. Vac. Sci. Technol.* A 15 (1997) 854–859.

D.N. McIlroy, S.–D. Hwang, K. Yang, N. Remmes, P.A. Dowben, Ahmad A. Ahmad, N.J. Ianno, J.Z. Li, J.Y. Lin, and H.X. Jiang, "The Incorporation of Nickel and Phosphorus Dopants into Boron Carbon Alloy Thin Films", *Applied Physics* A 67 (1998) 335–342.

Primary Examiner—Savitri Mulpuri
(74) Attorney, Agent, or Firm—Shook, Haryd & Bacon LLP (57) ABSTRACT

A non-doped n-type boron carbide semiconductor polytype and a method of fabricating the same is provided. The n-type boron carbide polytype may be used in a device for detecting neutrons, electric power conversion, and pulse counting. Such a device may include an n-type boron carbide layer coupled with a substrate where the boron carbide may be an electrically active part of the device. This n-type boron carbide layer may be fabricated through the use of closo-1, 7-dicarbadodecaborane (metacarborane). Specifically, the non-doped n-type polytype may be fabricated using SR-CVD by placing the substrate in a vacuum chamber, cooling the substrate, introducing metacarborane into the chamber, adsorbing the metacarborane onto the surface of the substrate through the use of incident X-ray radiation or electron beam irradiation, decomposing the adsorbed metacarborane, and allowing the substrate to reach ambient temperature. The n-type polytype of the present invention may also be fabricated by PECVD.

13 Claims, 8 Drawing Sheets

N-TYPE BORON-CARBIDE SEMICONDUCTOR POLYTYPE AND METHOD OF FABRICATING THE SAME

STATEMENT REGARDING FEDERALLY SPONSORED RESEARCH OR DEVELOPMENT

The Board of Regents of the University of Nebraska acknowledges that some funding for the research leading to this application was provided by the United States Government under Contract #N000140110626 by the Office of Naval Research.

CROSS REFERENCE TO RELATED APPLICATIONS

Not Applicable.

BACKGROUND OF THE INVENTION

The present invention relates to a boron carbide semiconductor polytype and a method for fabricating the same. More specifically, the present invention relates to a non-doped n-type boron carbide semiconductor polytype that may be used in the context of detecting the presence of neutrons and electric power conversion.

Neutron scattering is an important research method to determine the structure of solids and liquids. It is used to understand the forces that act between the atoms in these systems and to determine the magnetic behavior of materials as well. The research and practical applications cover a broad range of areas, from the basic properties of materials to studies of engineering and medical applications.

Boron is used in forming many solid state neutron detectors because of the large neutron capture cross-section of $^{10}$B. Boron carbide has the ability to withstand high temperatures, corrosive and mechanically abrasive environments, and may also be used in radioactive environments.

In the past, boron carbide/Si (111) heterojunction diodes have been fabricated from closo-1,2-dicarbadodecaborane ($C_2B_{10}H_{12}$-orthocarborane) by using synchrotron radiation induced chemical vapor deposition (SR-CVD) and plasma enhanced chemical vapor deposition (PECVD). While it has been realized that boron carbide exhibits a number of different semiconducting polytypes by using orthocarborane in fabricating the diode, all of them have been found to be nearly perfectly compensated semiconductors or slightly p-type. Since p-type p$^+$ heterojunction diodes generally have less boron containing semiconductor for the purposes of neutron detection or direct powerconversion than a p-n boron-carbide homojunction diode, n-type boron carbide semiconductor materials with n-type properties have been sought for diode fabrication.

Previously, in order to form a n-type boron carbide semiconductor, a metal dopant, such as nickel, was typically introduced into the fabrication process using most boranes, including orthocarborane. In particular, a source gas orthocarborane was used as a source gas to grow the boron carbide, while nickelocene ($Ni(C_5H_5)_2$) was used to introduce nickel into the growing film. The doping of nickel into the film transforms a p-type $B_5C$ material, relative to a lightly doped n-type silicon or p-type boron carbide, into an n-type material.

However, the use of a metal dopant to form a n-type boron carbide semiconductor has numerous drawbacks and deficiencies. For instance, the transition metal dopant can become an undesirable radioactive isotope when exposed to a highly radioactive environment. Furthermore, the use of a transition metal for doping lowers the resistivity of the resulting boron carbide layer from about $10^{10}$ ohm centimeters to about $10^5$ ohm centimeters or less thereby reducing the ability of this layer to act as a dielectric material, and may not have long term stabilities at elevated temperatures of about 250° C. or higher.

Accordingly, there remains a need for a boron carbide semiconductor polytype and method of fabricating the same that is n-type that will not produce undesirable radioactive isotopes when exposed to a radioactive environment. Further, there remains a need for a n-type boron carbide semiconductor that has adequate dielectric properties. The present invention fills these needs as well as various other needs.

SUMMARY OF THE INVENTION

In order to overcome the above-stated problems and limitations, and to achieve the noted objects, there is provided naturally occurring non-doped n-type boron carbide semiconductor polytype and a method of fabricating the same.

The semiconductor of the present invention may be used as heterojunction and homojunction neutron detection devices, as well as in the direct conversion of the neutron flux to current (i.e., direct conversion to electric power). In general, the neutron detection device may include a boron carbide layer coupled with a substrate layer. The boron carbide is naturally n-type and may be an electrically active part of the device.

The natural n-type boron carbide semiconductor of the present invention may be fabricated by decomposing closo-1,7-dicarbadodecaborane ($C_2B_{10}H_{12}$-metacarborane). Specifically, the natural n-type boron carbide semiconductor polytype of the present invention may be fabricated using synchrotron radiation induced chemical vapor deposition or electron beam induced chemical vapor deposition. This process includes the steps of providing for a substrate and metacarborane, placing the substrate in a vacuum chamber, cooling the substrate, introducing metacarborane into the vacuum chamber, adsorbing the metacarborane onto the surface of the substrate, and through the use of incident X-ray radiation or electron beam flux, decomposing the adsorbed metacarborane, and allowing the substrate to reach ambient temperature.

Furthermore, the boron carbide polytype of the present invention may also be fabricated by using plasma enhanced chemical vapor disposition. This process includes the steps of introducing the metacarborane into a chamber that contains the substrate, energizing the metacarborane, dehydrogenation of the metacarborane (i.e., deprotenation or causing hydrogen loss) to form a natural n-type boron carbide semiconductor polytype. Where the metacarborane is introduced at a pressure of about 60 mTorr, the process may further include introducing an inert gas source, such as, but not limited to, argon, krypton, neon and xenon, into the chamber to supply additional background pressure of about 240–640 mTorr. Further, nickelocene ($Ni(C_5H_5)_2$), chromocene ($Cr(C_2H_5)_2$), ferrocene ($Fe(C_5H_5)_2$), cobaltocene ($Co(C_2H_5)_2$) or manganocene ($Mn(C_5H_5)_2$)) may also be introduced into the chamber to make the boron carbide semiconductor of the present invention even more n-type.

Further objects, features, and advantages of the present invention over the prior art will become apparent from the detailed description of the drawings which follow, when considered with the attached figures.

BRIEF DESCRIPTION OF THE SEVERAL VIEWS OF THE DRAWINGS

In the accompanying drawings which form a part of the specification and which are to be read in conjunction therewith and in which like reference numerals are used to indicate like parts in the various views.

DETAILED DESCRIPTION OF THE INVENTION

Figure 1:
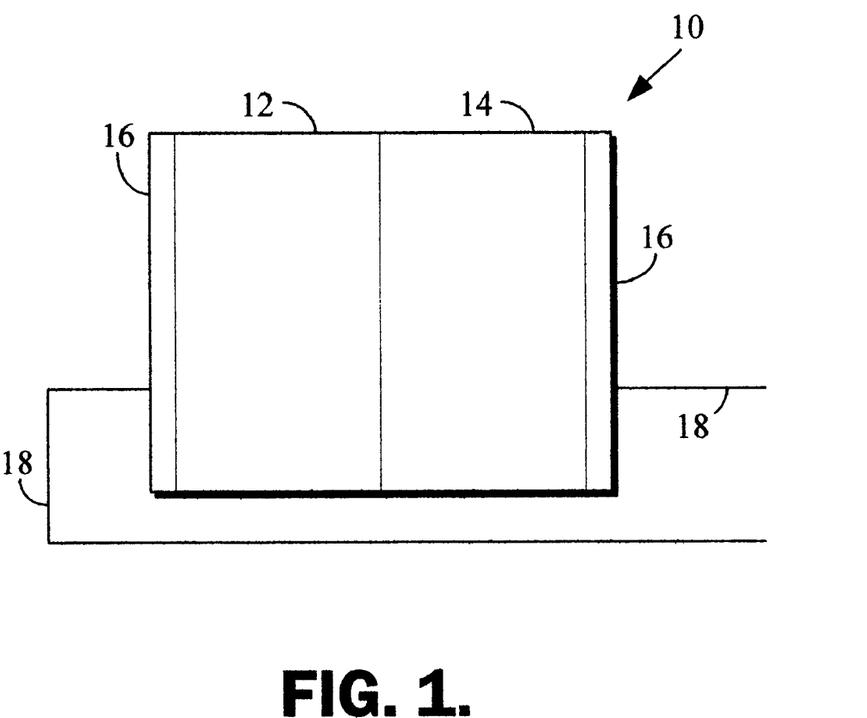
FIG. 1 is a schematic representation of a heterojunction diode having a natural n-type boron carbide semiconductor polytype according to the present invention.
Figure 3:
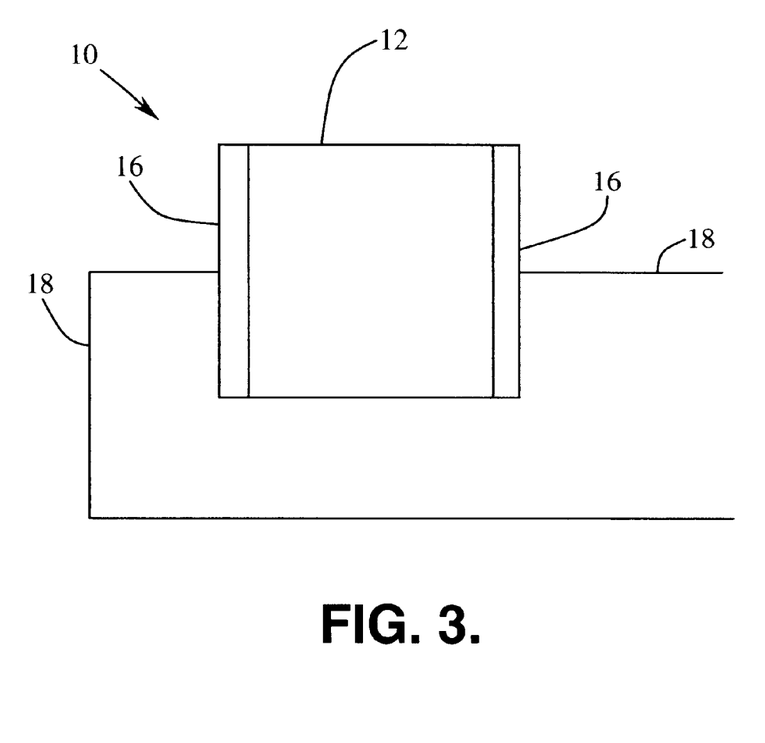
FIG. 3 is a schematic representation of a homojuction diode including the polytype of the present invention.

Referring now to the drawings in detail, and initially to FIG. 1, numeral 10 generally designates a heterojunction diode constructed with n-type boron carbide ($B_5C$) semiconductor polytype of the present invention. Specifically, diode 10 is shown as having a natural or non-doped n-type boron carbon semiconductor polytype 12 on a substrate 14. Substrate 14 is p-type and may be formed of a material including, but not limited to, silicon (Si(111)) doped to $7 \times 10^{14}$ cm$^3$ or more, silicon carbide (SiC), p-type boron carbide and the like. A pair of sputter-deposited electrodes 16 communicate with semiconductor 12 and substrate 14 and may be positioned on opposite ends of diode 10. Electrode 16 may be formed of a material including, but not limited to gold, silver, palladium, copper, aluminum or any combination thereof. Secured to each electrode 16 is a wire 18 that couples electrodes 16 to a bias voltage source and an electrical detection device such as a charge pulse measurement circuit. The sensory/measurement devices as well as monitoring devices are known and will not be discussed further. In addition, it is within the scope of the present invention to use the polytype discussed herein in homojunction diodes and other known semiconductor detection devices where the same material is used to form the p-n, n-p or other type of semiconductor as best seen in FIG. 3.

The n-type boron carbide semiconductor polytype 12 included in diode 10 may be used in the context of detecting the presence of neutrons, converting neutron flux to current and also for pulse counting. Essentially, a boron-rich carbon alloy is used as an electrically active semiconductor region of a detector and is placed where it can receive neutrons. In fact, the interface region of the diode, with associated dipole and charge, contains boron and therefore is both an electrically active part of the diode and contributes to the neutron capture cross-section of the diode. Neutrons may be detected with atoms which are the most likely to capture neutrons and where each neutron capture leads to the creation of one or more energetic charged particles whose mass is large compared with that of an electron and whose energy is large and can efficiently be converted to a measurable electrical signal. Boron atoms (particularly a $^{10}B$ isotope) are highly likely to capture neutrons (about 94%) and such neutron capture creates highly energetic ions as illustrated by the following reaction:

$^{10}B+n \rightarrow ^{7}Li(840\ keV)+\alpha(1.470\ MeV)+\gamma(480\ keV)$

A more detailed discussion of using boron carbide as an electrically active part of a neutron detection device is included in U.S. application Ser. No. 09/856,966 to Dowben, filed on Sep. 6, 2001, which is herein incorporated by reference.

Figure 2:
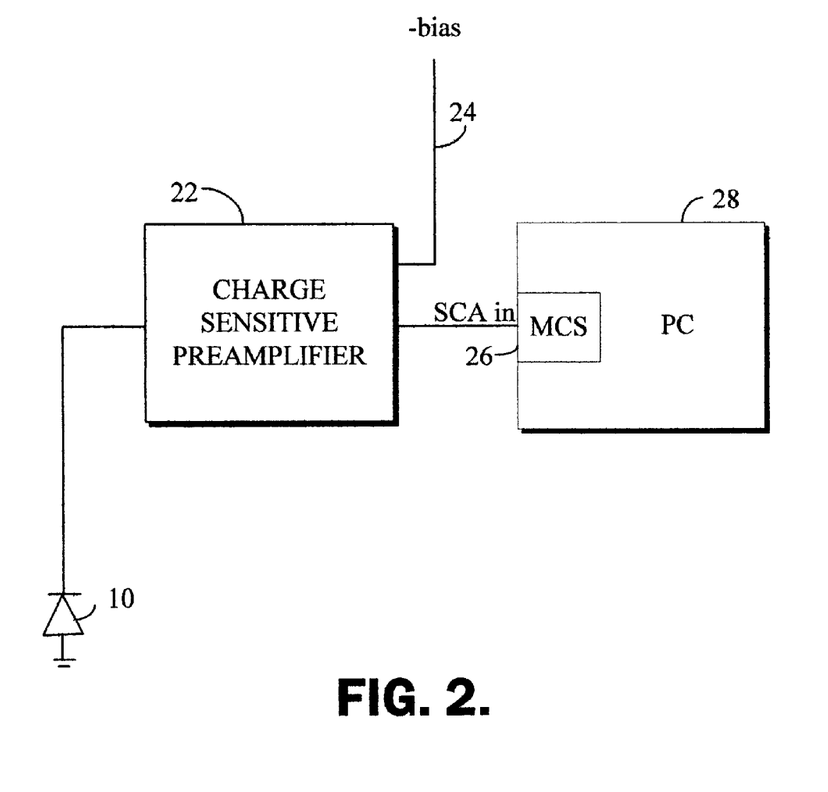
FIG. 2 is a schematic representation of a testing device used with the n-type boron carbide semiconductor polytype of the present invention.

As best seen in FIG. 2, diode 10 having boron carbide layer 12 is coupled with a test device to detect the presence of neutrons. In particular, diode 10 is connected to a charge sensitive preamplifier 22. Charge sensitive preamplifier 22, in turn, is connected to a bias voltage input 24 and a single channel analyzer/multichannel scaler 26 which is connected to a computer 28. The impending neutrons are intercepted by diode 10 which leads to dense local ionization of atoms and the production of electron-hole pairs (at least of order $5 \times 10^5$ pairs per neutron reaction), many of which are collected due to the applied bias voltage and form a charge pulse which is registered and counted by external circuitry.

Figure 4:
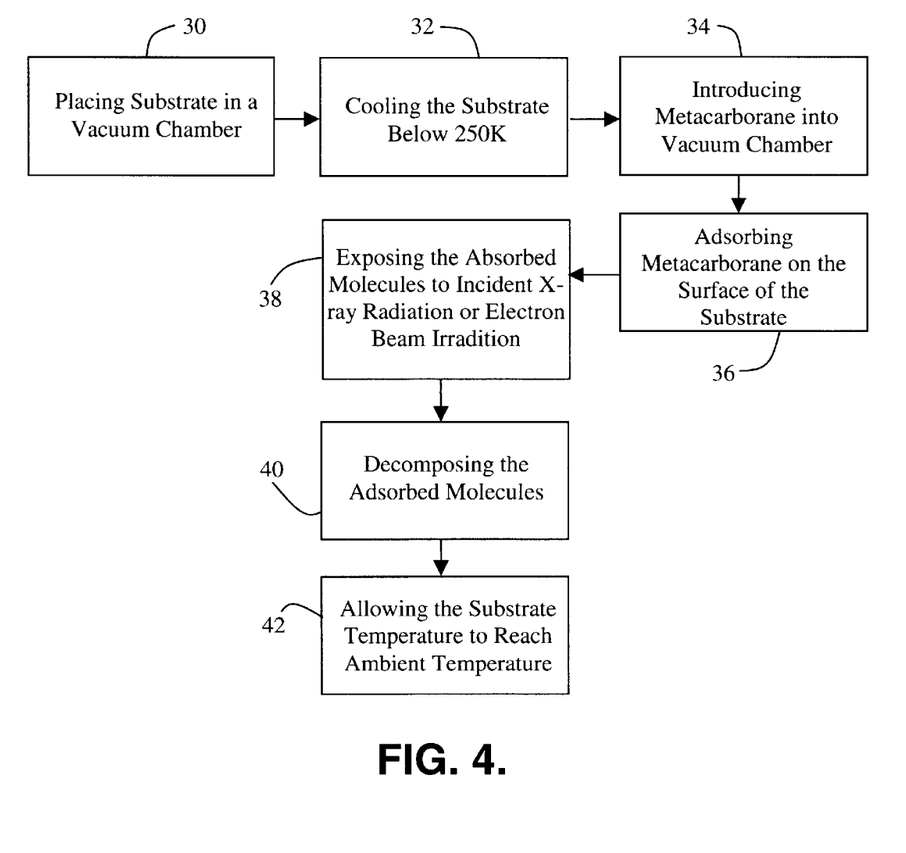
FIG. 4 is a flowchart of the fabrication process of the n-type boron carbide semiconductor polytype.

The p-n and n-p heterojunction diode 10 having a natural n-type boron carbide semiconductor layer 12 may be fabricated from closo-1,7 dicarbadodecaborane ($C_2B_{10}H_{12}$-metacarborane) using synchrotron radiation induced chemical vapor deposition (SR-CVD) as best seen in FIG. 4. In forming the heterojunction diode, the substrate is first placed in a vacuum chamber as shown in step 30. As seen in step 32, the substrate is then cooled to a temperature below about 250° K. A small amount of metacarborane (sublimed from the solid) is then introduced into the vacuum chamber in step 34, and adsorbed on the surface of the substrate in step 36. Next, the adsorbed molecules are exposed to incident X-ray radiation or electron beam irradiation at step 38 causing the molecules to decompose at step 40. The X-ray radiation may be provided by a synchrotron, incident electron beam, fixed cathode source or the like. To form the diode 10 having a natural n-type boron carbide layer 12, it will be understood and appreciated that the incident X-ray radiation may be provided from a synchrotron or an incident electron beam. Finally, the temperature of the substrate is then elevated or allowed to reach ambient temperature at step 42.

Furthermore, the boron carbide semiconductor having a natural n-type boron carbide layer may also be grown on a p-type substrate using metacarborane by plasma-enhanced chemical vapor deposition (PECVD) as disclosed in U.S. Pat. No. 4,957,773 to Spenser et al., U.S. Pat. No. 5,468,978 to Dowben and U.S. Pat. No. 5,658,834 to Dowben, which are expressly incorporated by reference herein. Specifically, the deposition of n-type boron carbide onto a substrate may be undertaken in a custom designed parallel plate 13.56 MHz radio frequency PECVD chamber as described in U.S. Pat. No. 4,957,773 to Spencer et al., which is hereby incorporated by reference.

Figure 5:
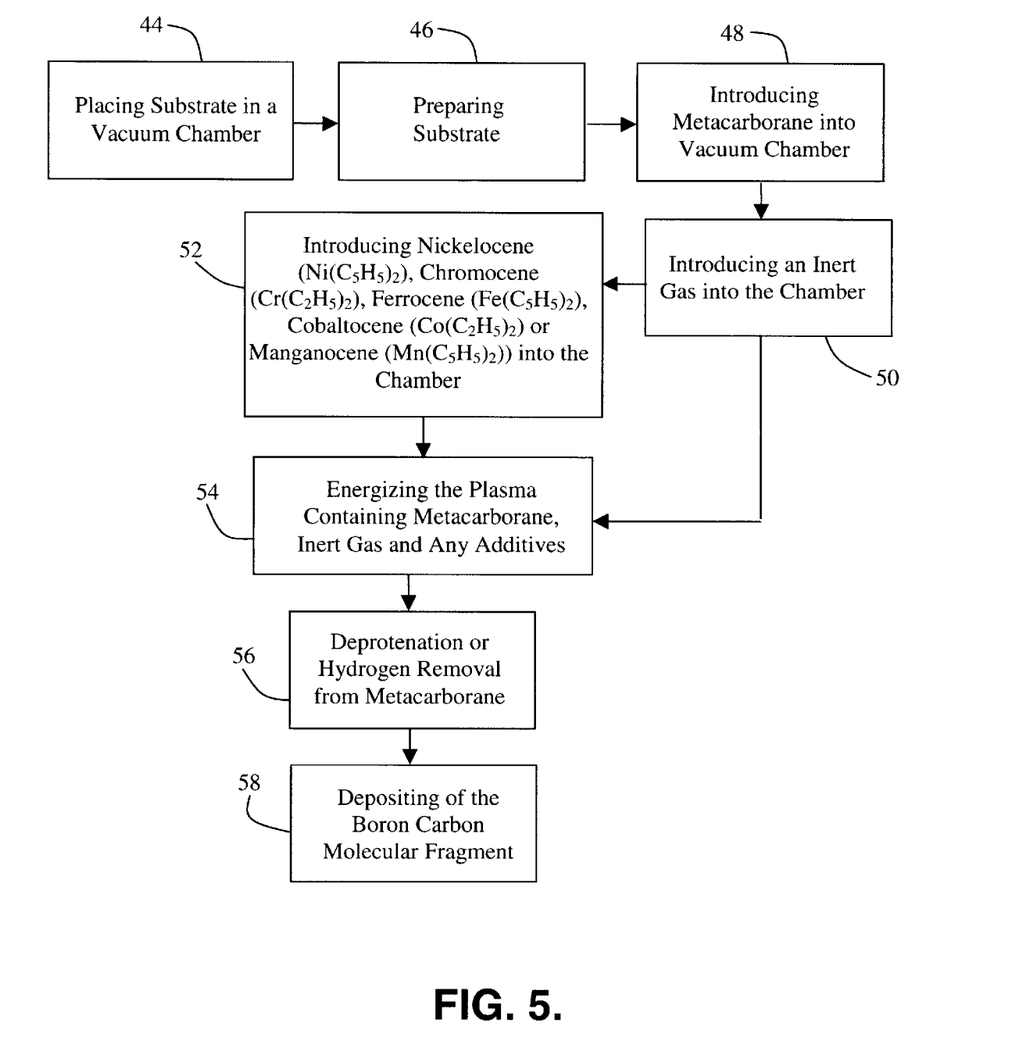
FIG. 5 is a flowchart of another fabrication process of the n-type boron carbide semiconductor polytype.

In particular, as best seen in FIG. 5, the substrate is placed in a vacuum chamber as seen in step 44. Next, the surface of the substrate, such as silicon (Si(111)), is then prepared by Ar+ ion sputtering in the plasma reactor, or by H-termination, ex situ, using a dilute HF and NaOH pretreatment in step 46. Metacarborane is then introduced into the chamber at an ambient pressure of about 60 mTorr as provided in step 48. An inert source gas such as, but not limited to, argon, krypton, neon, or xenon, may be introduced into the chamber at pressures between about 240–640 mTorr in step 50 to increase the missing background pressure to about 300–700 mTorr. While metacarborane is used to grow the n-type boron carbide, nickelocene ($Ni(C_5H_5)_2$), chromocene ($Cr(C_2H_5)_2$), ferrocene ($Fe(C_5H_5)_2$), cobaltocene ($Co(C_2H_5)_2$) or manganocene ($Mn(C_5H_5)_2$), may be introduced into the chamber in step 52 to make the resulting semiconductor even more n-type. In step 54, the plasma containing metacarborane, inert gas and additives are then energized through the use of incident X-rays or an electron beam. In addition, it will be understood that the process may go directly from step 50 to step 54 if the additives (i.e., nickelocene, chromocene, ferrocene, cobaltocene, or manganocene) are not introduced into the chamber. The energizing of metacarborane operates to strip the ex-polyhedral hydrogen atoms from the metacarborane (i.e., deprotenation) in step 56. The resulting carborane molecular fragments adsorb and are deposited on substrate 14 in step 58 to form a heterojunction diode having a natural n-type boron carbide semiconductor polytype layer of the present invention.

Figure 6:
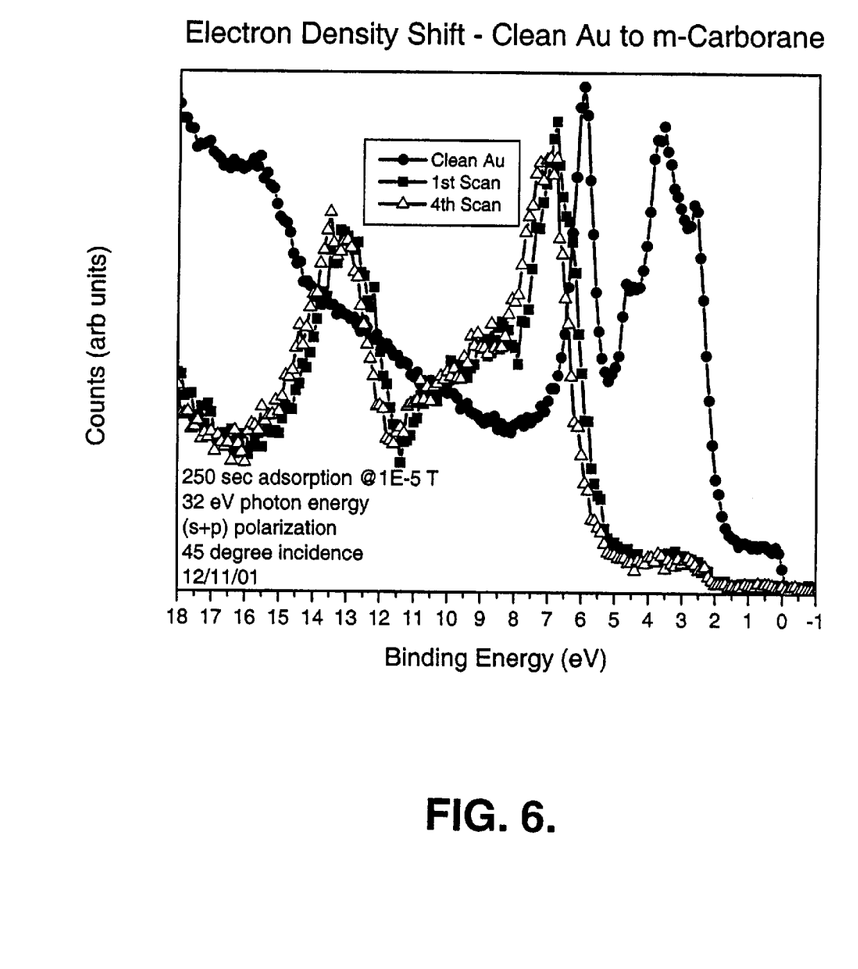
FIG. 6 is a graph of a series of photo emission spectra showing the electron density of states shift of metacarborane to the n-type polytype of $B_5C$ with clean Au superimposed.
Figure 7:
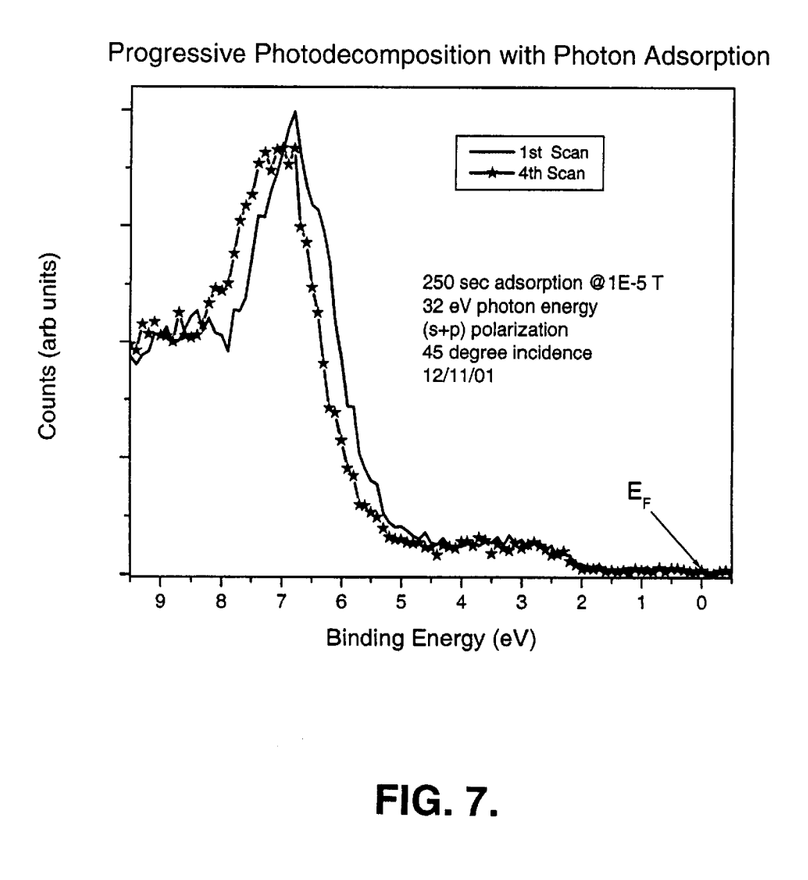
FIG. 7 is a graph of a series of photo emission spectra showing progressive photo decomposition with photon absorption and evidence of n-type dielectric properties.
Figure 8:
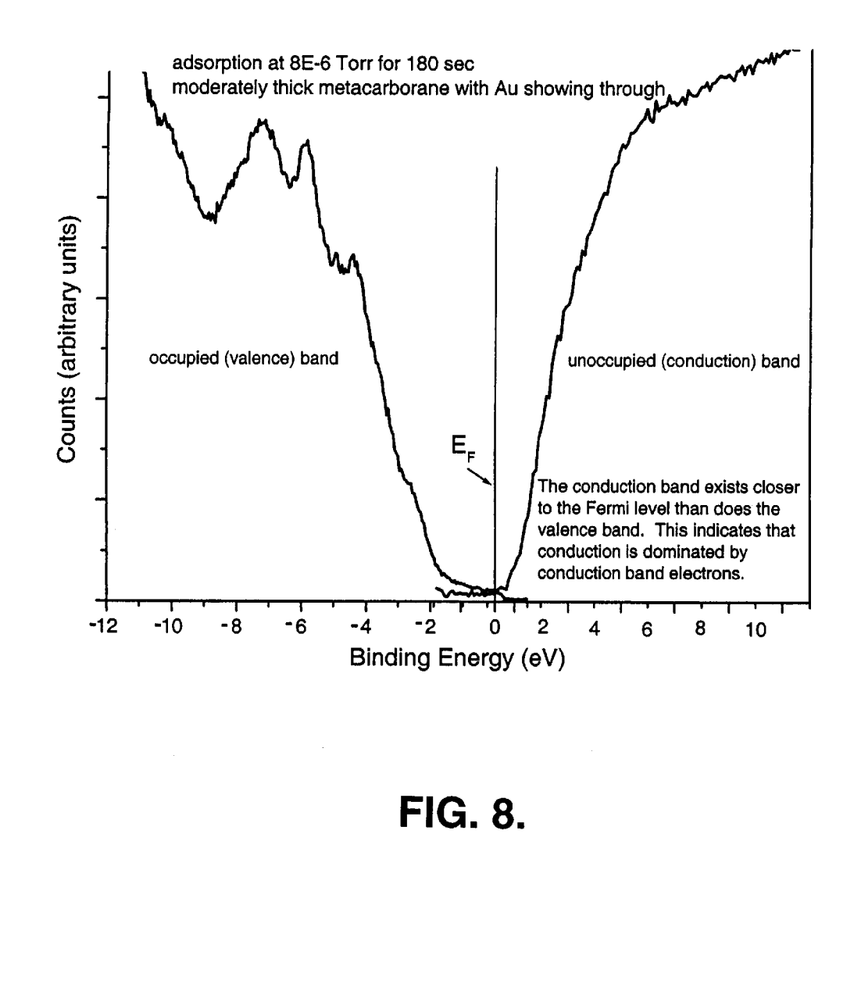
FIG. 8 is a graph showing combined photo emission and inverse photo emission illustrating that the Fermi level is positioned closer to the conduction band edge, also indicating n-type character.

The resulting natural n-type boron carbide polytype formed from metacarborane is fundamentally different than previous boron carbide formed from orthocarborane. As best seen in FIG. 6, the graph shows the electron density shift of clean Au to metacarborane where the valance band edge shifts away from the Fermi level which is characteristic of an n-type material. With reference to FIG. 7, the progressive photo decomposition with photon absorption illustrates in more detail that the valance band edge moves away from the Fermi level, which is opposite of that observed with p-type materials formed with orthocarborane. Furthermore, as best seen in FIG. 8, the combined photo emission and inverse photo emission show that the Fermi level is positioned closer to the conduction band edge, again demonstrating n-type character. The boron carbide formed from orthocarborane is typically a dielectric with a resistivity of about $10^{10}$ ohm centimeters. Because the polytype of boron carbide formed from metacarborane exhibits substantially more effective photovoltaic charging, the polytype of the present invention may be a better dielectric compared to the boron carbide formed from orthocarborane.

As stated above, the natural n-type boron carbide polytype may also be used in converting neutron flux into current. In particular, the boron carbide formed from metacarborane combined with boron carbide formed from orthocarborane may be used to form a diode. Given the fact that the four quadrant conductivity is under irradiation, the incident neutrons may be used to create a small current from electron hole pair formation at the p-n junction interface.

It can, therefore, be seen that the invention is one that is designed to overcome the drawbacks and deficiencies existing in the prior art. In particular, the natural n-type boron carbide semiconductor polytype of the present invention may serve as a dielectric barrier layer. In addition, the boron carbide semiconductor of the present invention does not produce undesirable radioactive isotopes (i.e. "activated" radioactive species) when exposed to a radioactive environment as was the case with previous methods for n-type fabrication using transition metal doping.

While particular embodiments of the invention have been shown, it will be understood, of course, that the invention is not limited thereto, since modifications may be made by those skilled in the art, particularly in light of the foregoing teachings. Reasonable variation and modification are possible within the scope of the foregoing disclosure of the invention without departing from the spirit of the invention.

What is claimed is:

1. A process for forming a boron carbide semiconductor polytype, said process comprising:

providing a substrate;

providing closo-1,7 dicarbadodecaborane (metacarborane);

introducing said metacarborane into a chamber that contains said substrate;

cooling said substrate;

adsorbing said metacarborane onto said substrate; and decomposing said adsorbed metacarborane, wherein the boron carbide semiconductor polytype is non-doped n-type.

2. The process of claim 1, wherein said substrate is cooled to a temperature below about 250K.

3. The process of claim 1, wherein said adsorbed closo-1,7 dicarbadodecaborane is decomposed by incident X-ray radiation.

4. The process of claim 3, wherein said incident X-ray radiation is provided by a synchrotron.

5. The process of claim 3, wherein said incident X-ray radiation is provided by an incident electron beam.

6. The process of claim 3, wherein said incident X-ray radiation is provided by a fixed cathode source.

7. The process of claim 1, wherein said adsorbed closo-1,7 dicarbadodecaborane is decomposed by electron beam irradiation.

8. The process of claim 1, wherein said substrate elevates to ambient temperature.

9. A process of forming a boron carbide semiconductor polytype, said process comprising:

providing a substrate;

providing closo-1,7 dicarbadodecaborane (metacarborane);

introducing said metacarborane into a chamber that contains said substrate;

energizing said metacarborane;

deprotenating said metacarborane to form a boron-carbon molecular fragment; and depositing said boron-carbon molecular fragment on said substrate to form a non-doped n-type boron carbide semiconductor polytype.

10. The process of claim 9, wherein said metacarborane is introduced at a pressure of about 60 mTorr, and further introducing an inert gas source into said chamber to supply additional background pressure of about 240–640 mTorr.

11. The process of claim 10, wherein said inert gas source is selected from the group consisting of argon, krypton, neon, xenon and other inert gases.

12. The process of claim 9, further comprising:

introducing nickelocene ($Ni(C_5H_5)_2$), chromocene ($Cr(C_2H_5)_2$), ferrocene ($Fe(C_5H_5)_2$), cobaltocene ($Co(C_2H_5)_2$) or manganocene ($Mn(C_5H_5)_2$)) into said chamber.

13. The process of claim 9, wherein said energizing is by incident X-rays or an electron beam.

\* \* \* \* \*